(12) United States Patent
Chen

(10) Patent No.: US 8,132,608 B2
(45) Date of Patent: Mar. 13, 2012

(54) DIE BONDING APPARATUS

(75) Inventor: Yu-Jen Chen, Tainan (TW)

(73) Assignee: Gio Optoelectronics Corp., Sinshih Township, Tainan County (TW)

( * ) Notice: Subject to any disclaimer, the term of this patent is extended or adjusted under 35 U.S.C. 154(b) by 323 days.

(21) Appl. No.: 12/466,002

(22) Filed: May 14, 2009

(65) Prior Publication Data

US 2009/0283220 A1 Nov. 19, 2009

(30) Foreign Application Priority Data

May 15, 2008 (TW) .............................. 97117897 A

(51) Int. Cl.
- *B29C 65/02* (2006.01)
- *B29C 65/50* (2006.01)
- *B32B 37/10* (2006.01)
- *B32B 38/10* (2006.01)
- *B31F 5/00* (2006.01)
- *B31F 5/06* (2006.01)
- *B65H 29/24* (2006.01)
- *B65H 29/32* (2006.01)
- *B65H 29/56* (2006.01)
- *B29C 65/18* (2006.01)
- *B32B 37/04* (2006.01)
- *B32B 37/16* (2006.01)

(52) U.S. Cl. ......... 156/556; 156/538; 156/539; 156/550

(58) Field of Classification Search ............. 156/580, 156/556, 538, 539

See application file for complete search history.

(56) References Cited

U.S. PATENT DOCUMENTS

| | | | | |
|---|---|---|---|---|
| 4,908,092 A * | 3/1990 | Koibuchi | .................. | 156/556 |
| 6,159,327 A * | 12/2000 | Forkert | ...................... | 156/264 |
| 6,347,655 B1 * | 2/2002 | Yamamoto et al. | ........... | 156/540 |
| 6,546,985 B2 * | 4/2003 | Aoki | ............................ | 156/363 |
| 6,722,412 B2 * | 4/2004 | Huang et al. | ................. | 156/499 |
| 7,182,118 B2 * | 2/2007 | Cheung et al. | ............... | 156/556 |
| 7,395,847 B2 * | 7/2008 | Teshirogi et al. | ............. | 156/581 |
| 7,464,850 B2 * | 12/2008 | Kim | ............................ | 228/4.1 |
| 7,886,796 B2 * | 2/2011 | Ok | ............................ | 156/379.8 |
| 2003/0145939 A1 * | 8/2003 | Ahn et al. | ..................... | 156/235 |
| 2008/0128081 A1 * | 6/2008 | Wang et al. | .................. | 156/285 |
| 2009/0120589 A1 * | 5/2009 | Kang et al. | ..................... | 156/539 |

FOREIGN PATENT DOCUMENTS

| | | |
|---|---|---|
| CN | 1744294 A | 3/2006 |
| CN | 1835197 A | 9/2006 |
| CN | 101164150 B | 4/2008 |
| JP | 10321652 A | 12/1998 |

* cited by examiner

*Primary Examiner* — Sonya Mazumdar
(74) *Attorney, Agent, or Firm* — Birch, Stewart, Kolasch & Birch, LLP

(57) ABSTRACT

A die bonding apparatus cooperates to a die and a substrate having a die bonding surface. The die bonding apparatus includes a carrier, a die ejecting mechanism and a substrate holding mechanism. The carrier carries the die. The die ejecting mechanism has at least one ejecting unit. The substrate holding mechanism holds the substrate and is disposed opposite to the die ejecting mechanism. The substrate and the carrier move relatively to each other in two dimensions on a plane parallel to the die-bonding surface. The carrier is located between the die ejecting mechanism and the substrate. The ejecting unit pushes against the carrier for transferring the die on the carrier onto the die bonding surface of the substrate.

15 Claims, 10 Drawing Sheets

DIE BONDING APPARATUS

CROSS REFERENCE TO RELATED APPLICATIONS

This Non-provisional application claims priority under 35 U.S.C. §119(a) on Patent Application No(s). 097117897 filed in Taiwan, Republic of China on May 15, 2008, the entire contents of which are hereby incorporated by reference.

BACKGROUND OF THE INVENTION

1. Field of Invention

The present invention relates to a manufacture apparatus and, in particular, to a die bonding apparatus.

2. Related Art

With the advancement of the semiconductor technology, the semiconductor elements are widely used and this expands the usage of the dies. The manufacturing processes of the delicate element such as the die can only go smoothly while cooperating to a delicate machine. For example, the die can be picked up and released by a die bonding apparatus that is called a die bonder.

With reference to FIG. 1, the conventional die bonding apparatus 1 includes an ejecting mechanism 11, a pick-up mechanism 12, a conveyor 13, and a glue dispenser 14. The dies 31 are disposed in an array on the blue tape 32 and located between the ejecting mechanism 11 and the pick-up mechanism 12. The conveyor 13 conveys a substrate 2. After the substrate 2 enters to the entry of the conveyor 13, the glue is placed by the glue dispenser 14 on the substrate 2 where the dies 31 are desired to be placed; and then the substrate 2 is conveyed to the processing zone. Meanwhile, the ejecting mechanism 11 pushes up the dies 31 that the pick-up mechanism 12 desires to pick up, and the operation of the pick-up mechanism 12 is as follows: moving downward to pick up the pushed-up dies 31; moving up to above the substrate 2; moving downward to place the dies 31 on the substrate 2 for bonding with the glue; and moving up and back to above the ejecting mechanism 11.

As mentioned above, with the picking and movement of the pick-up mechanism 12, the dies are moved and disposed on the substrate 2 by the blue tape. Hence, the moving speed and moving distance of the pick-up mechanism 12 are the keys to the speed for manufacturing the die bonding apparatus 1. As the substrate size grows larger, the moving distance of the pick-up mechanism 12 will increase; this lowers the manufacturing speed and increases the cost. Additionally, the pick-up mechanism 12 has to be moved in a high speed, and such delicate mechanism with the high speed usually leads to the increase in cost. Therefore, it is an important subject to provide a die-bonding apparatus for applying in the manufacturing processes of the substrates with various sizes to reduce the costs of equipment and manufacturing.

SUMMARY OF THE INVENTION

In view of the foregoing, the present invention is to provide a die bonding apparatus that can reduce the manufacturing time.

To achieve the above, a die bonding apparatus according to the present invention, which cooperates to a die and a substrate having a die bonding surface, includes a carrier, a die ejecting mechanism, and a substrate holding mechanism. The carrier carries the die. The die ejecting mechanism has at least one ejecting unit. The substrate holding mechanism holds the substrate and is disposed opposite to the die ejecting mechanism. The substrate and the carrier move relatively to each other in two dimensions on a plane parallel to the die bonding surface. The carrier is located between the die ejecting mechanism and the substrate. The ejecting unit pushes against the carrier for transferring the die on the carrier onto the die bonding surface of the substrate.

To achieve the above, a die bonding apparatus of the present invention, which cooperates to a die and a substrate having a die bonding surface, includes a carrier, a die ejecting mechanism, and a substrate holding mechanism. The carrier carries the die. The die ejecting mechanism has at least one ejecting unit. The substrate holding mechanism holds the substrate and is disposed opposite to the die ejecting mechanism. The substrate and the die ejecting mechanism move relatively to each other in two dimensions on a plane parallel to the die bonding surface. The carrier is located between the die ejecting mechanism and the substrate, and the ejecting unit pushes against the carrier for transferring the die on the carrier onto the die bonding surface of the substrate.

As mentioned above, in a die bonding apparatus of the present invention, the die ejecting mechanism and the substrate holding mechanism of the holding substrate are disposed opposite to each other and the carrier carrying the die is disposed between the die ejecting mechanism and the substrate. The die is disposed opposite to the die bonding surface of the substrate and when the ejecting unit of die ejecting mechanism pushes against the carrier, the die is pushed up and directly transferred to the die bonding surface of the substrate. Compared to the conventional pick-up mechanism for disposing the die onto the substrate by picking up the die, the die bonding apparatus of the present invention reduces the manufacturing time and makes it possible to apply on the substrates with various sizes. In addition, the cost of the die bonding apparatus can be reduced without the conventional pick-up mechanism.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
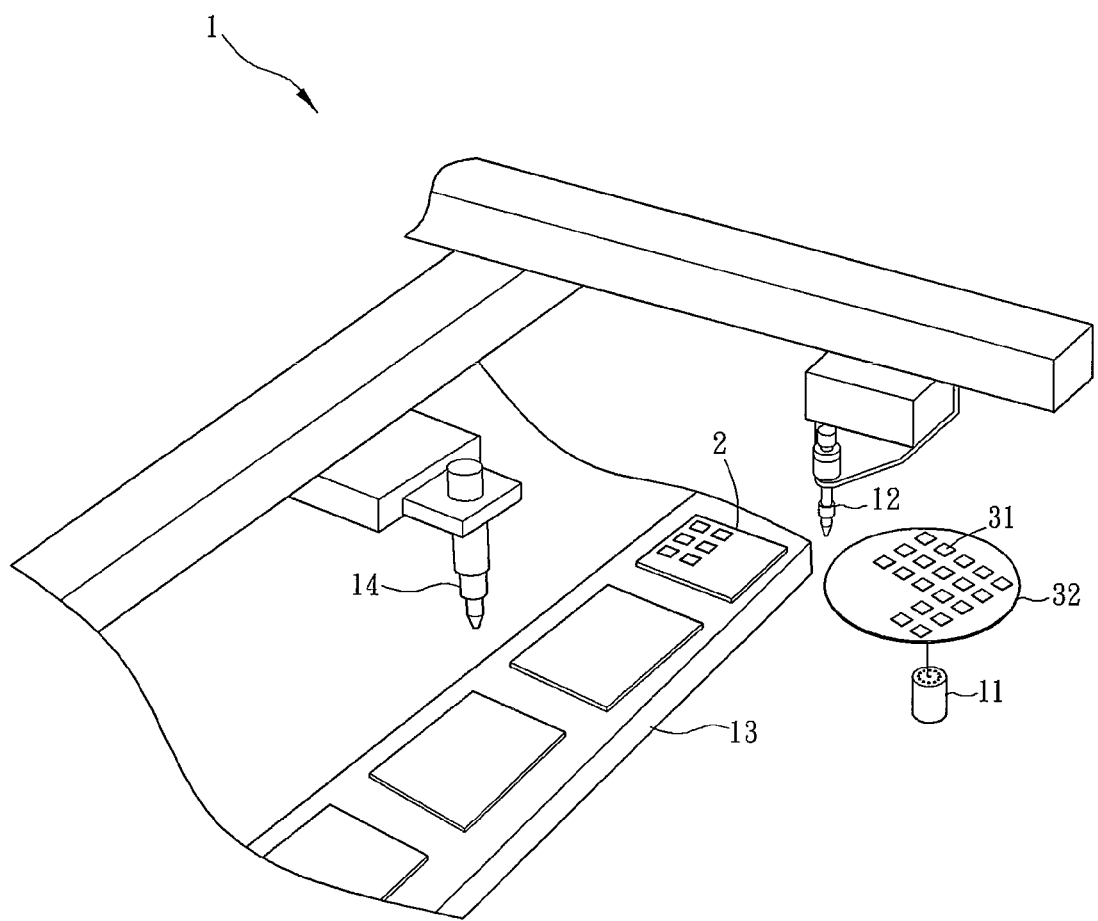
FIG. 1 is a schematic view of a conventional die bonding apparatus.
Figure 2:
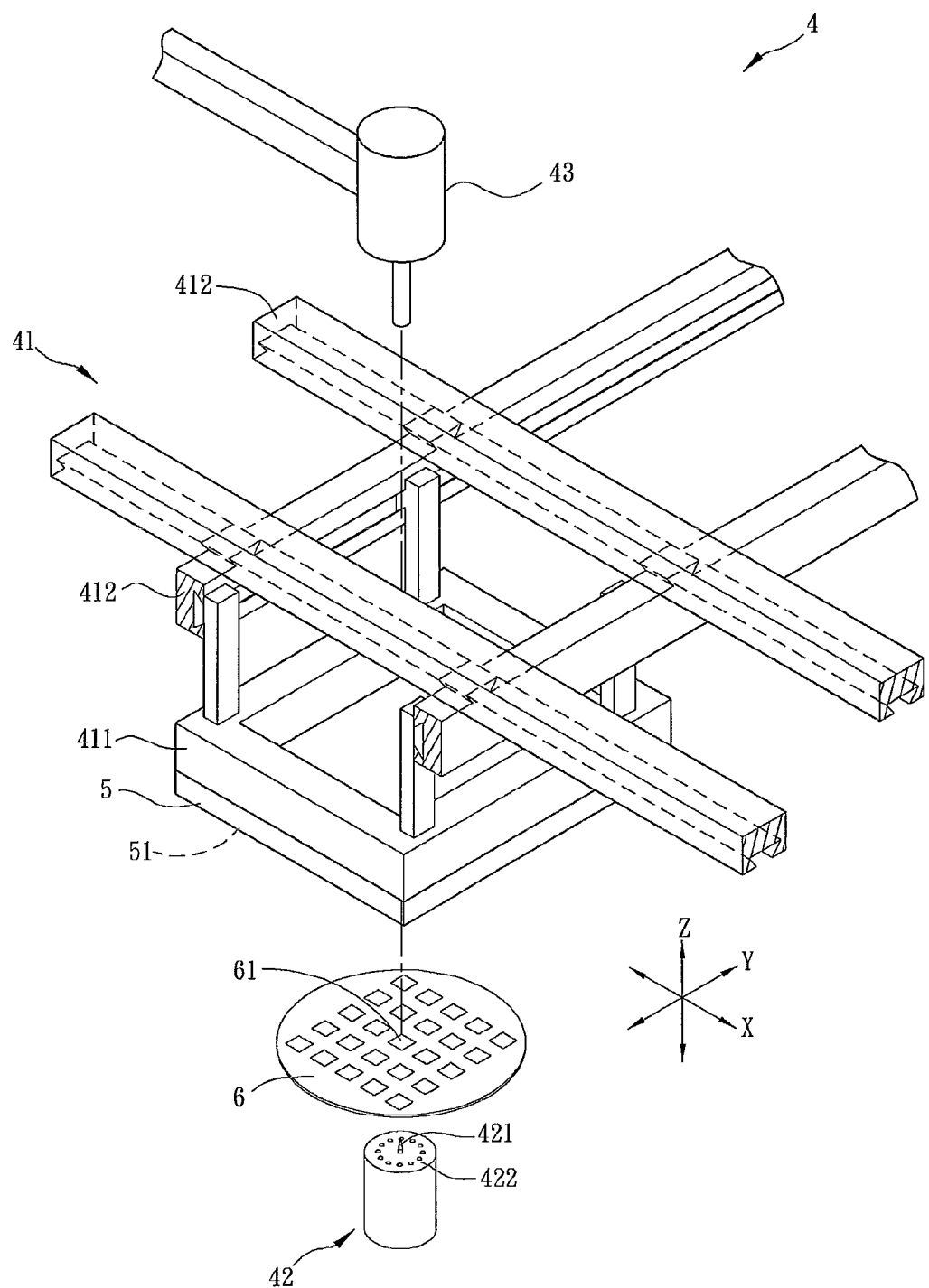
FIG. 2 is a schematic view of a die bonding apparatus according to a first embodiment of the present invention.

FIG. 2 is a schematic view of a die bonding apparatus 4 according to a preferred embodiment of the present invention. With reference to FIG. 2, the die bonding apparatus 4 cooperates to a substrate 5 and a carrier 6. The substrate 5 may have, for example, the widths and lengths that are greater than 10 cm and includes a die bonding surface 51. The carrier 6 has at least one die 61. In the embodiment, the substrate 5 may be a plastic substrate, a glass substrate, or a printed circuit board (PCB) substrate. The die 61 may be, for example, a solar cell die, an LED die, or other semiconductor element that has not been packaged. The die 61 is bonded to the blue tape. In the embodiment, the die bonding apparatus 4 includes a substrate holding mechanism 41, a die ejecting mechanism 42, a position sensing mechanism 43, and a carrier 6.

The substrate 5 may be a plastic substrate, a glass substrate, or a PCB substrate, thus the substrate holding mechanism 41 may also be a plastic substrate holding mechanism, a glass substrate holding mechanism, or a PCB substrate holding mechanism. The substrate holding mechanism 41 includes a holding unit 411 and a first shift unit 412. The substrate holding mechanism 41 is disposed opposite to the die ejecting mechanism 42. The holding unit 411 holds the substrate 5 and makes the substrate 5 and the die ejecting mechanism 42 move relatively to each other in two dimensions on a plane parallel to the die bonding surface 51. In the embodiment, the holding unit 411 may be a suction unit, a clamping unit, a supporting unit, a suspending unit, an air float unit, a suction and air float unit, or their combination for holding the substrate 5. When the holding unit 411 is a suction unit, it may be but not limited to a vacuum suction unit or an electrostatic chuck (ESC) for attaching to a surface of the substrate 5 that is opposite to the die bonding surface 51.

As shown in FIG. 2, the first shift unit 412 drives the holding unit 411 to shift along X-direction, Y-direction, or Z-direction in one dimension, two dimensions, or three dimensions, where the X-direction, Y-direction, and Z-direction represent the directions of axes and are not limited to the directions pointed by the arrows in the figure.

The die ejecting mechanism 42 includes an ejecting unit 421 and a suction unit 422, which is disposed surrounding the ejecting unit 421. In the embodiment, the suction unit 422 is, for example, a vacuum suction unit.

The position sensing mechanism 43 may be an optical position sensing mechanism, for instance, a CCD camera or an image sensor. The substrate 5 held by the holding unit 411 is located between the position sensing mechanism 43 and the die ejecting mechanism 42. In addition, in the embodiment, the carrier 6 may be a blue tape carrying the LED and supported by a metal frame or a plastic frame (not shown).

In general, the sensing lens of the position sensing mechanism 43 and the ejecting unit 421 of the die ejecting mechanism 42 are aligned to each other. In the embodiment, the position sensing mechanism 43 may detect the relative positions of at least two of the die 61 on the carrier 6, the die ejecting mechanism 42, and the substrate 5 in two dimensions on a plane parallel to the die bonding surface 51, such that the substrate 5 and the die ejecting mechanism 42 move relatively to each other in two dimensions on the plane parallel to the die bonding surface 51. Additionally, in the embodiment, the position sensing mechanism 43 may also sense the gap between the die 61 on the carrier 6 and the substrate 51 along a direction (Z-direction as shown in FIG. 2) perpendicular to the die bonding surface 51 for adjusting the gap between the carrier 6 and the substrate 51, such that when the ejecting unit 421 pushes against the carrier 6, the die 61 may be correctly transferred to the die bonding surface 51 of the substrate 5.

Figure 3:
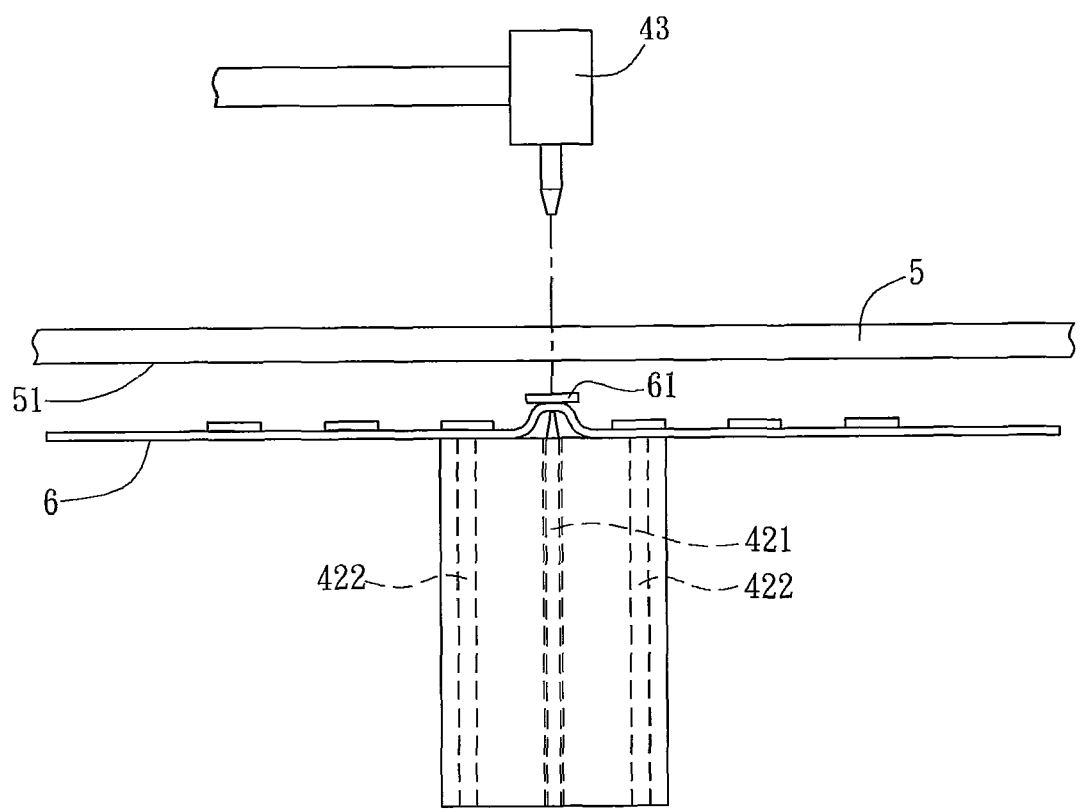
FIG. 3 is a partial side view of the die bonding apparatus in operation according to the first embodiment of the present invention.

FIG. 3 is a partial side view of the die bonding apparatus 4 in operation. With reference to FIGS. 2 and 3, the carrier 6 is located between the die ejecting mechanism 42 and the substrate 5. The die bonding surface 51 of the substrate 5 is facing downward (the Z-direction arrow as shown in FIG. 2). The substrate 5 is disposed above the ejecting unit 421, the suction unit 422 picks up the carrier 6 so the die 61 faces toward the die bonding surface 51 of the substrate 5, and the ejecting substrate 421 pushes against the carrier 6 for transferring the die 61 on the carrier 6 onto the die bonding surface 51 of the substrate 5.

First Embodiment

When the substrate 5 is a transparent substrate and driven by a first shift unit 412 such that the substrate 5 and the die ejecting mechanism 42 move relatively to each other in two dimensions on a plane parallel to the die bonding surface 51, the steps of transferring a target die 61 onto the die bonding surface 51 of the substrate 5 by the carrier 6 are further illustrated as follows.

Firstly, the holding unit 411 attaching to the substrate 5 is driven by the first shift unit 412 and shifted to a proper position. That is, the holding unit 411 moves the substrate 5 to the proper position so that the area of the die bonding surface 51, where the die 61 is to be disposed, aligns the ejecting unit 421. Because the substrate 5 is transparent and may have alignment marks, it can be confirmed that the pushed die 61 is located on the predetermined position of the die bonding surface 51 with the assistance of the position sensing mechanism 43. If the position is deviated, the position sensing mechanism 43 may notify the first shift unit 412 to move the substrate 5 to the proper position.

Next, the suction unit 422 of the die ejecting mechanism 42 picks up the carrier 6 and the ejecting unit 421 pushes the carrier 6 from below to push up a target die 61 for transferring onto the die bonding surface 51 of the substrate 5 (e.g. the die bonding surface 51 has the bonding material or the surface of the target die 61 facing toward the substrate 5 has the bonding material). Therefore, during each die bonding, the substrate 5 is moved in a short distance by the first shift unit and the ejecting unit 421 pushes up the target dies 61, so that the dies 61 on the carrier 6 may be disposed to the corresponding positions on the substrate 5 for reducing the operating steps of the die bonding apparatus 4. Furthermore, by pushing up the dies 61 from below may also prevent other dies 61 surrounding the carrier 6 from falling during the pushing up of the target dies 61.

Second Embodiment

Figure 4A:
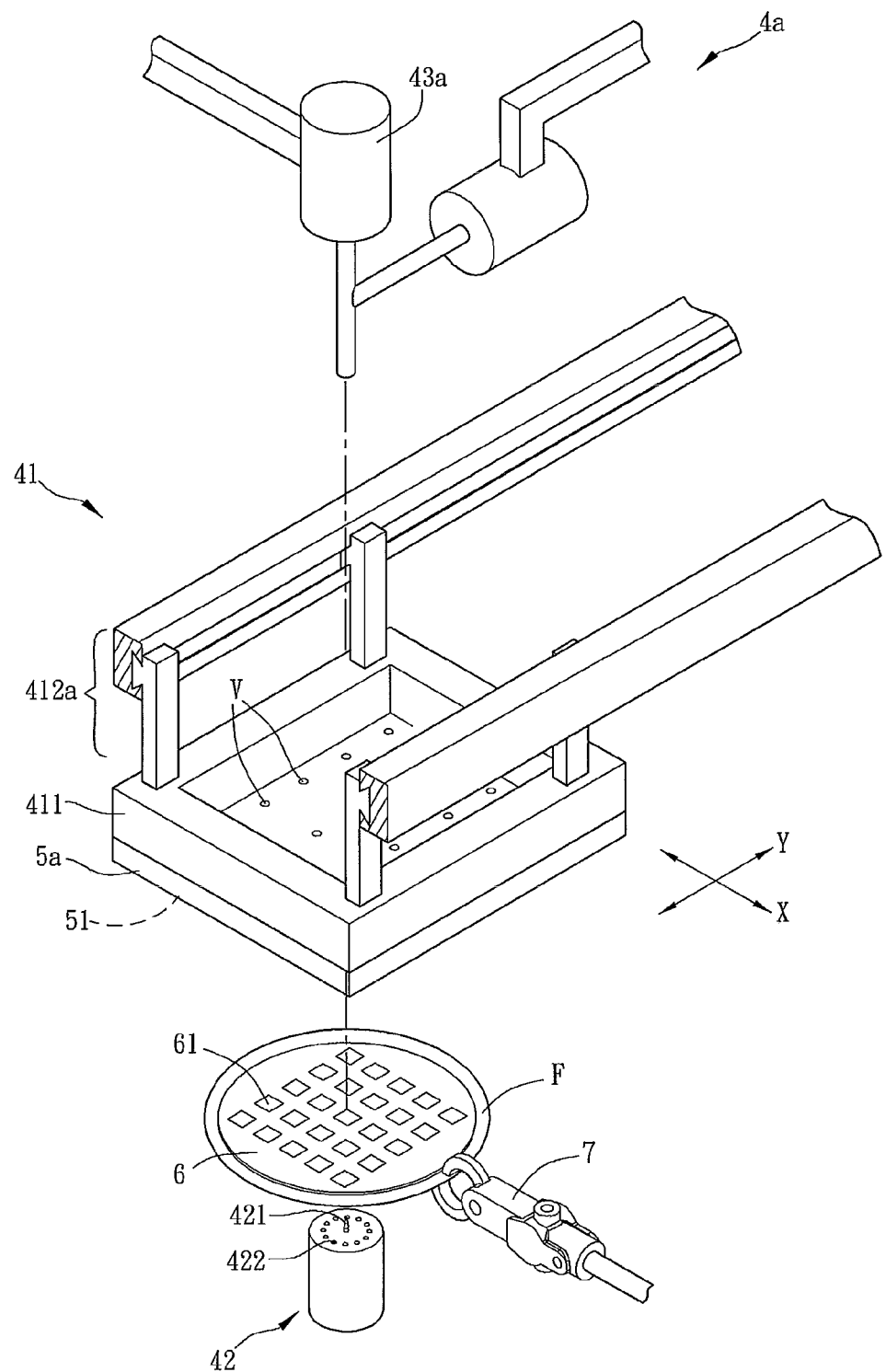
FIG. 4A is a schematic view of a die bonding apparatus according a second embodiment of the present invention.
Figure 4B:
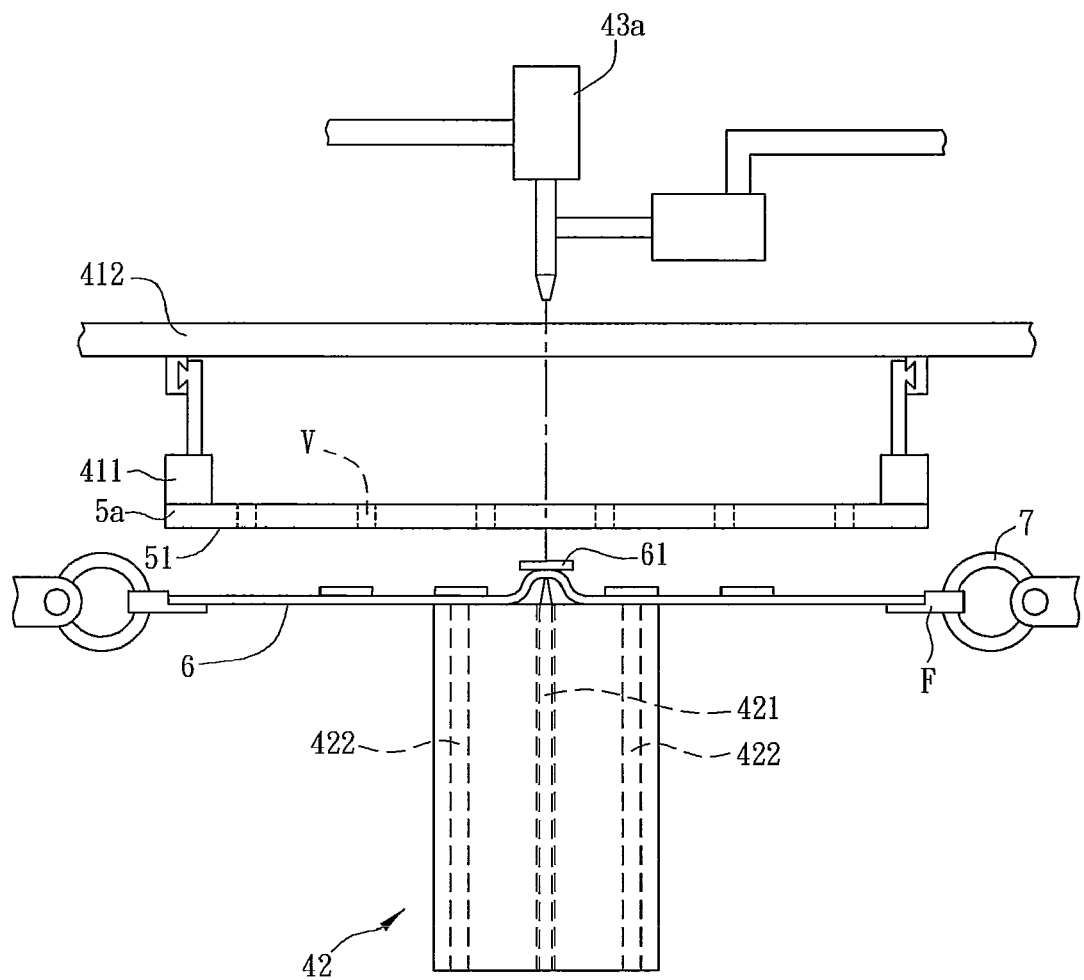
FIG. 4B is a partial side view of the die bonding apparatus in operation according to the second embodiment of the present invention.

FIG. 4A is a schematic view of a die bonding apparatus and FIG. 4B is a partial side view of the die bonding apparatus in operation. With reference to FIGS. 4A and 4B, the substrate 5a is an opaque PCB and may have a plurality of vias V, which are disposed adjacent to the predetermined die bonding points (on the same surface with the die bonding surface 51) of the dies 61. Theoretically, the size of the via V is larger than that of the die 61. The first shift unit 412a drives the substrate 5a to move on the X-Y plane and the carrier 6 is supported by a frame F. The die bonding apparatus 4a further includes a third shift unit 7 for driving the carrier 6 to shift relatively to the die ejecting mechanism 42 in two dimensions. The third shift unit 7 is a mechanical arm for example; it may also be a slide rail that drives the carrier 6 to shift on the X-Y plane.

In the embodiment, the substrate 5a and the carrier 6 moving relatively to each other along a direction parallel to the die bonding surface 51 in two dimensions can be achieved by using the first shift unit 412a to drive the substrate 5a and the third shift unit 7 to drive the carrier 6.

Moreover, the position sensing mechanism 43a in the embodiment may have a plurality of analyzing modules, which sense the positions of different objects after a set of optical lens is used for dividing the spectrum, such that the position sensing mechanism 43a can sense the positions of the vias V and the die 61 at the same time so to find out the positions precisely and quickly. Moreover, when the substrate 5a is a transparent substrate as abovementioned embodiment, the position sensing mechanism 43a can sense the die bonding point and the die 61 at the same time.

The substrate 5a is an opaque PCB, thus the operation process of the die bonding apparatus 4a is slightly different. The operation process is illustrated as follows: the sensing lens of the position sensing mechanism 43a and the ejecting unit 421 of the die ejecting mechanism 42 are originally aligned to each other, and the position sensing mechanism 43a detects the position of at least one die 61 on the carrier 6 by one of the vias V of the substrate 5a. Next, the third shift unit 7 is used to drive the carrier 6 for placing the die 61, which is to be pushed up, to right above the ejecting unit 421. After that, the first shift unit 412a drives the substrate 5a to move for shifting a target die bonding point on the substrate 5a to right above the ejecting unit 421 and align with the die 61. Because the coordinates of the a plurality of vias V on the substrate 5a and a plurality of die bonding points are built in the first shift unit 412a, even though the position sensing mechanism 43a cannot detect the die bonding point, it can still calculate the relative distance according to the coordinates of the die bonding point and the closest via V for moving the substrate 5a, such that the target die bonding point can be moved to right above the ejecting unit 421.

At last, the suction unit 422 of the die ejecting mechanism 42 picks up the carrier 6, and the ejecting unit 421 pushes against the carrier 6 from below to push up a target die 61 for directly transferring the target die 61 to the target die bonding point (e.g. the bonding material is already placed on the target die bonding point or on the surface of the die 61 facing toward the substrate 5a) of the substrate 5a.

Therefore, the dies 61 on the carrier 6 may be displaced one-by-one to the corresponding positions on the substrate 5a, such that the operating steps of the die bonding apparatus 4a may be reduced so to save the manufacturing time. Additionally, since the die bonding point is next to the via V, the moving distance of the substrate 5a from the via V (the ejecting unit 421 is moved from the place aligning the via V to the place aligning the die bonding point of the substrate) is smaller than the moving distance of the substrate as the prior art that aligning the alignment mark on the edge of the substrate in advance. Hence the number of errors occurred during the movement of the first shift 412 may be reduced to enhance the precision of the product. Furthermore, other dies 61 on the carrier 6 may be prevented from falling by pushing up the die 61 from below, such that the material will not be wasted.

Figure 5:
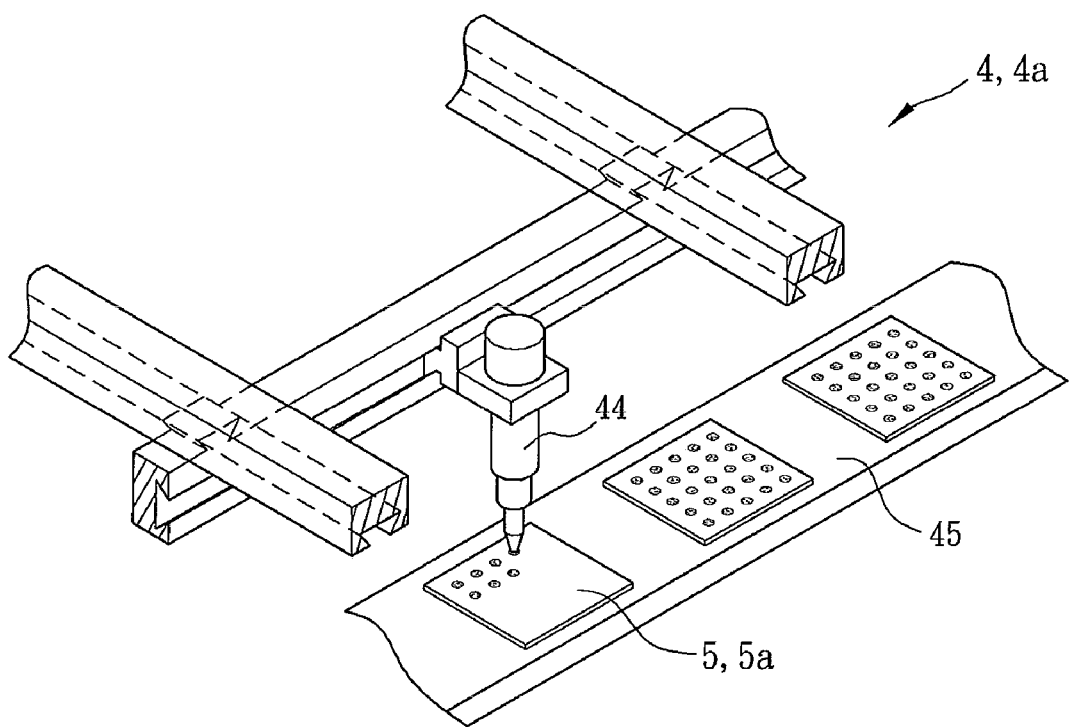
FIG. 5 is a schematic view of a bonding material disposition mechanism of a die bonding apparatus according to a preferred embodiment of the present invention.

FIG. 5 is a schematic view of a bonding material disposition mechanism of a die bonding apparatus. With reference to FIG. 5, in the embodiment, the die bonding apparatuses 4 and 4a may further include a bonding material disposition mechanism 44, which may be, for example, a glue dispenser disposed adjacent to the die ejecting mechanism 42 and opposite to the die bonding surface 51 of the substrates 5 and 5a. The substrate 5 and 5a are transported in the die bonding apparatuses 4 and 4a by a transporting mechanism 45, and then the bonding material disposition mechanism 44 is to place a bonding material on the position where the die 61 is desired to be disposed on the die bonding surface 51 on the substrates 5 and 5a, respectively. The bonding material may be a thermal curing adhesive an UV curing adhesive, or a pressure-sensitive glue. The die bonding apparatuses 4 and 4a may have a corresponding curing mechanism, for instance, an electrical heat source, an ultrasound friction heat source, or a light source, for different bonding materials.

The bonding material disposition mechanism 44 may be disposed at different positions depending on the actual needs. For example, when the bonding material is disposed on the die 61, the bonding material disposition mechanism 44 may be disposed opposite to the die 61. Of course, the bonding material may be disposed on the die 61 or the die bonding surface 51 on the substrates 5 and 5a before the die 61 or the substrates 5 and 5a enters the die bonding apparatus 4 and 4a. In other words, the bonding material disposition mechanism 44 may not be disposed in the die bonding apparatuses 4 and 4a.

Figure 6:
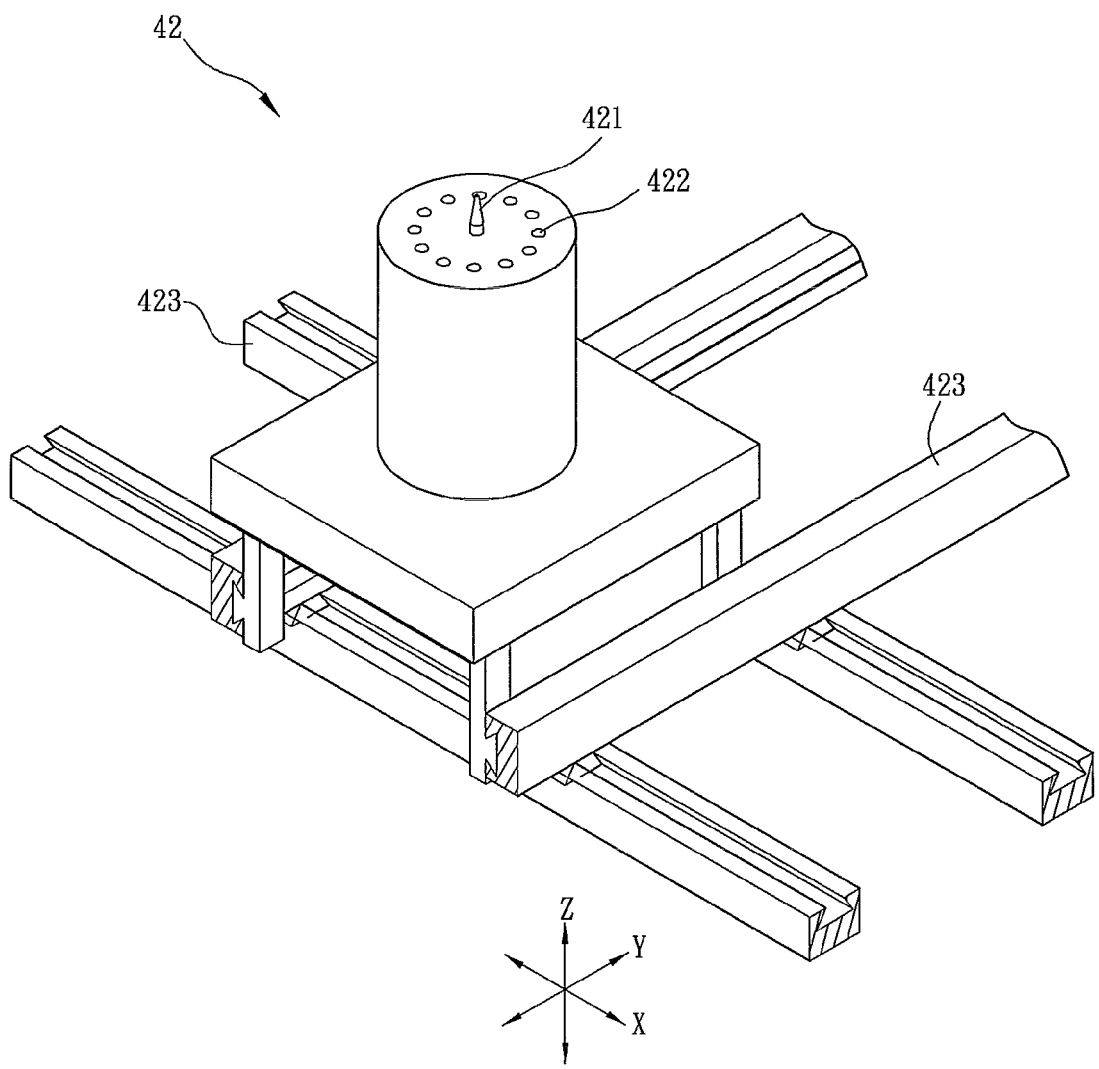
FIG. 6 is a schematic view of a die ejecting mechanism having a second shift unit in the die bonding apparatus according to the preferred embodiment of the present invention.

FIG. 6 is a schematic view of a die ejecting mechanism having a second shift unit in the die bonding apparatus. With reference to FIG. 6, in the above embodiments, the die ejecting mechanism 42 may also include a second shift unit 423 for driving the ejecting unit 421, the suction unit 422, or both at the same time to shift along the X-direction, Y-direction, or Z-direction in one dimension, two dimensions, or three dimensions, as shown in FIG. 6. In other words, the relative positions of or the distances between the die ejecting mechanism 42, the substrates 5 and 5a, and the die 61 on the carrier 6 in the above-mentioned embodiment may be adjusted by moving the first shift unit 412 or the second shift unit 423.

Figure 7A:
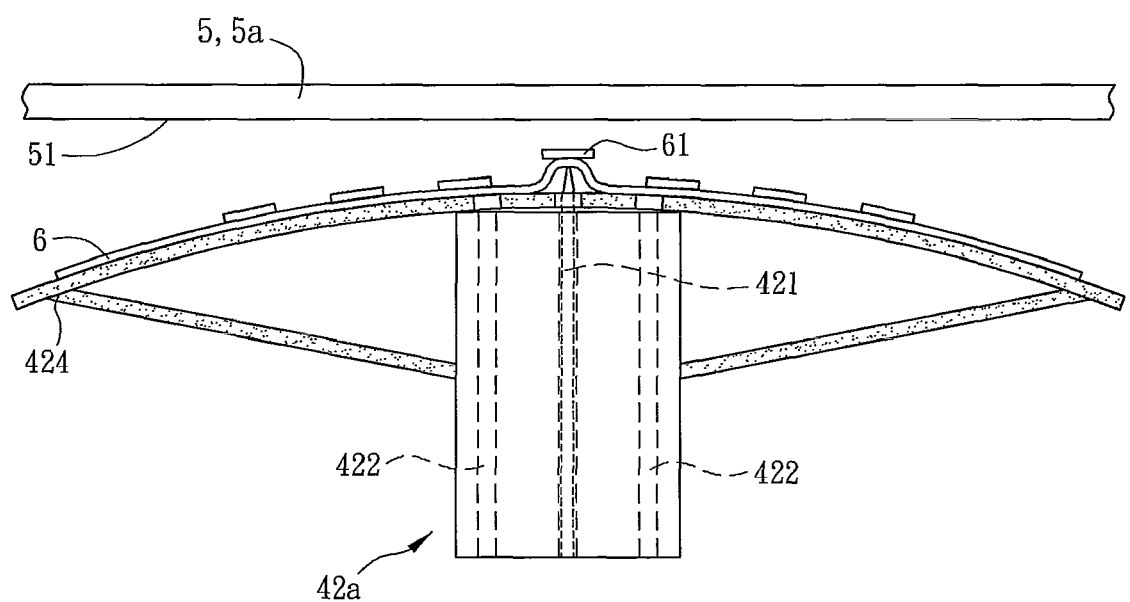
FIGS. 7A, 7B, and 7C are schematic views of the curved surfaces of the die ejecting mechanism contacting the carrier in the die bonding apparatus according the preferred embodiment of the present invention.
Figure 7B:
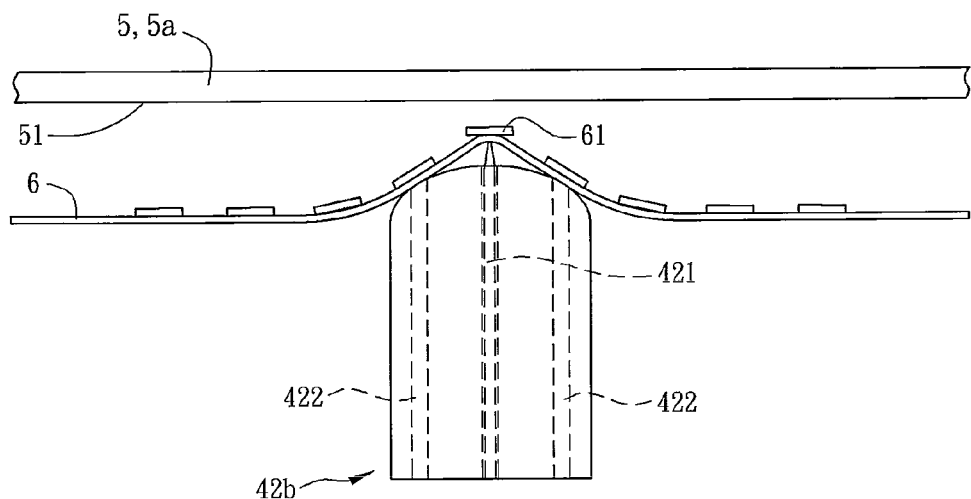
Figure 7C:
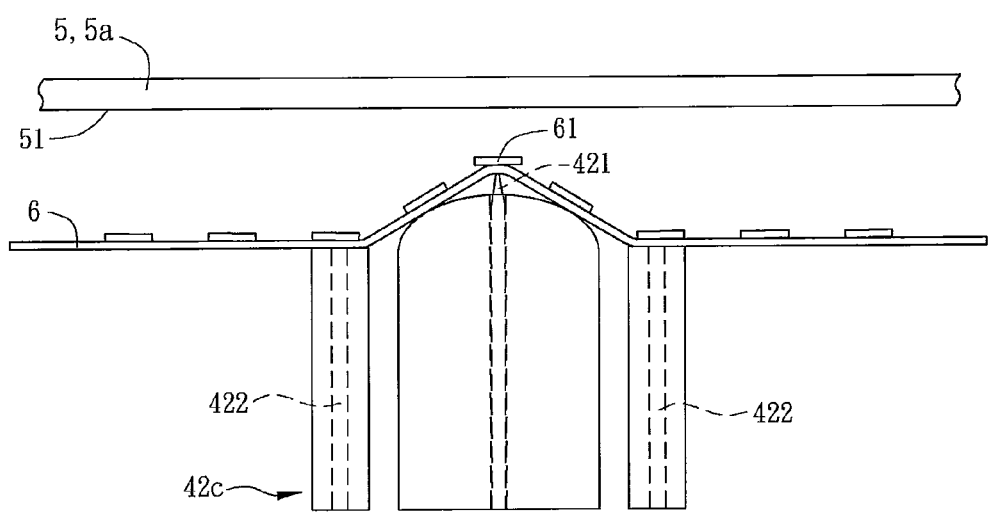

To make sure the ejecting unit 421 can precisely push up the corresponding die 61 without affecting the other dies surrounding the corresponding die 61, the contact surface between the die ejecting mechanism 42 and the carrier 6 may be the above-mentioned plane, or a curved surface. With reference to FIG. 7A, the die ejecting mechanism 42a may include a curved unit 424, which is disposed on the ejecting unit 421. In the embodiment, the curved unit 424 contains holes corresponding to the ejecting unit 421 and the suction unit 422, such that the ejecting unit 421 and the suction unit 422 may operate correctly through the holes. The curved unit 424 is used to place the die 61 attaching to the substrate 5 or 5a at the highest point of the carrier 6, so the other dies surrounding the die 61 cannot contact the substrate 5 or 5a easily. For the same effect, the contact surface between the die ejecting mechanism 42a and the carrier 6 may as well be a curved surface in FIGS. 7B and 7C. FIG. 7B is a schematic view of the ejecting unit 421 and the suction unit 422 of the die ejecting mechanism 42b with the curved surface in operation. FIG. 7C is a schematic view of the ejecting unit 421 and the suction unit 422 disposed adjacent to the ejecting unit 421 of the die ejecting mechanism 42c with the curved surface in operation.

Figure 8:
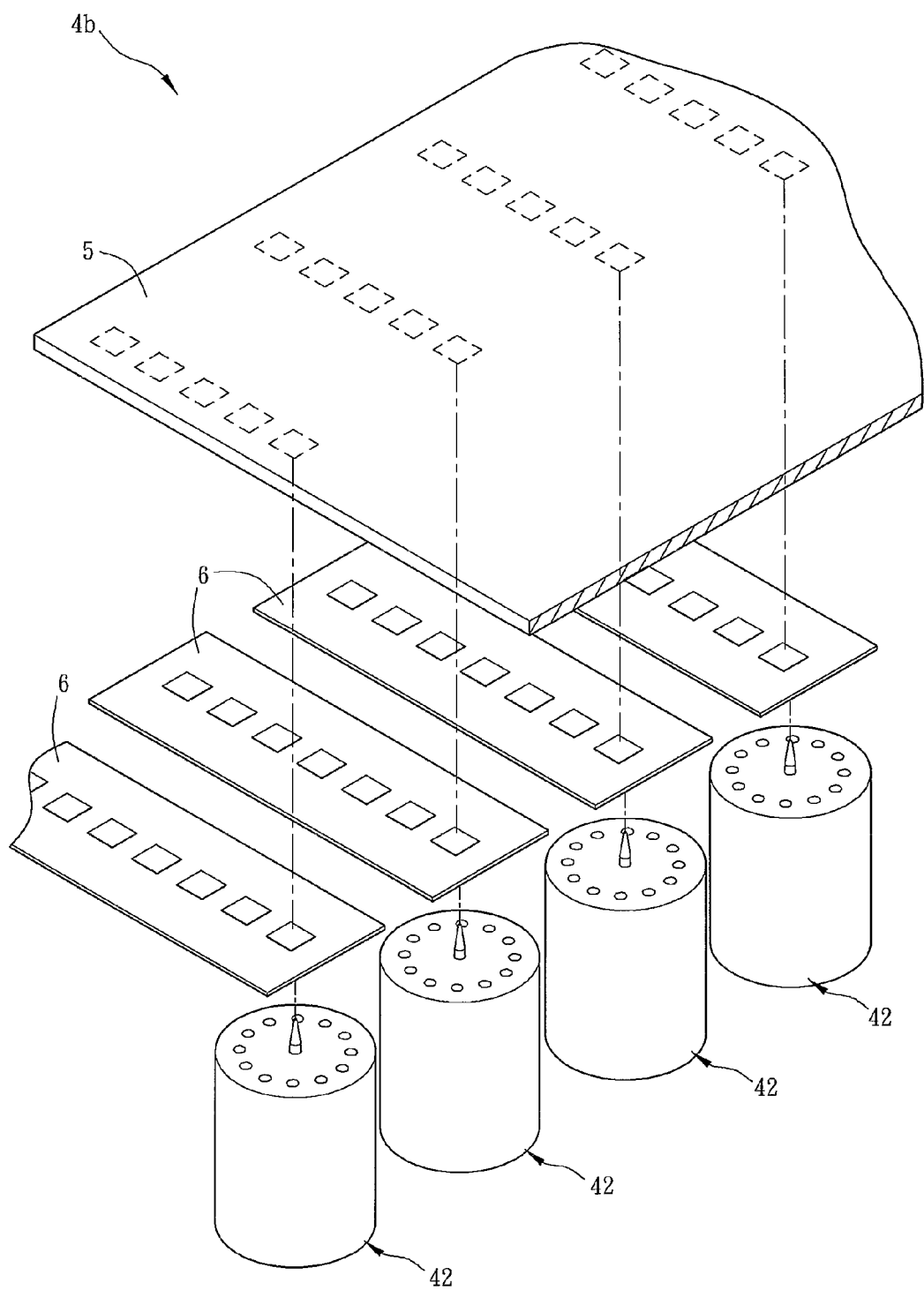
FIG. 8 is a schematic view of the die bonding apparatus having a plurality of die ejecting mechanisms according to the preferred embodiment of the present invention.

In addition, another aspect of the die bonding apparatus according to the preferred embodiment of the present invention is shown in FIG. 8. The die bonding apparatus 4b may have a plurality of die ejecting mechanisms 42, which can operate simultaneously or respectively for disposing the dies located on the carriers 6 to the die bonding surface 51 of the substrate 5, such that the manufacturing speed can be accelerated. The structure and operation of each die ejecting mechanism 42 are the same as those of the die ejecting mechanism in the above-mentioned embodiment, thus a detailed description thereof is omitted herein.

Furthermore, the aspect of the ejecting unit below the holding unit is used as an example in the above embodiment rather than a limitation. For instance, the ejecting unit is disposed above or opposite to the holding unit, but not limited to these.

To sum up, in the die bonding apparatus of the present invention, the die ejecting mechanism and the substrate holding mechanism are disposed opposite to each other and the carrier carrying the die is disposed between the die ejecting mechanism and the substrate. The die is disposed opposite to the die bonding surface of the substrate. When the ejecting unit of the die ejecting mechanism pushes against the carrier, the die is pushed up and directly transferred to the die bonding surface of the substrate. Thus, as long as the substrate holding mechanism and the carrier move to the proper positions, the dies can be disposed on the substrate one-by-one as cooperating to other element such as the shift unit or the position mechanism. Compared to the conventional pick-up mechanism that picks up and disposes the dies on the substrate, the die bonding apparatus of the present invention may save the manufacturing time and be applied to the substrates in various sizes. In addition, the cost of the die bonding apparatus may be reduced without the conventional pick-up mechanism.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A die bonding apparatus cooperating to a die and a substrate having a die bonding surface, comprising:
    a carrier carrying the die;
    a die ejecting mechanism having at least one ejecting unit; and
    a substrate holding mechanism holding the substrate and disposed opposite to the die ejecting mechanism, the substrate and the carrier moving relatively to each other in two dimensions on a plane parallel to the die bonding surface,
    wherein the carrier is located between the die ejecting mechanism and the substrate, and the at least one ejecting unit pushes against the carrier for transferring the die on the carrier directly onto the die bonding surface of the substrate, and
    wherein the die bonding surface of the substrate faces downward, the substrate is disposed above the at least one ejecting unit, and the at least one ejecting unit pushes against the carrier from below.

2. The die bonding apparatus according to claim 1, wherein the substrate holding mechanism is a plastic substrate holding mechanism, a glass substrate holding mechanism, or a printed circuit board (PCB) substrate holding mechanism.

3. The die bonding apparatus according to claim 1, wherein the substrate holding mechanism comprises a holding unit maintaining the substrate to be disposed opposite to the die ejecting mechanism.

4. The die bonding apparatus according to claim 3, wherein the holding unit is a suction unit, an air float unit, a clamping unit, a supporting unit, a suspending unit, or a suction and air float unit.

5. The die bonding apparatus according to claim 3, wherein the holding unit is a vacuum suction unit or an electrostatic chuck (ESC).

6. The die bonding apparatus according to claim 3, wherein when the holding unit is a suction and air float unit, the suction and air float unit keeps a gap between the holding unit and the substrate.

7. The die bonding apparatus according to claim 3, wherein the substrate holding mechanism further comprises a first shift unit for driving the holding unit to shift.

8. The die bonding apparatus according to claim 1, wherein the die ejecting mechanism further comprises a second shift unit for driving the at least one ejecting unit to shift.

9. The die bonding apparatus according to claim 1, wherein the die ejecting mechanism further comprises a suction unit disposed adjacent to or surrounding the at least one ejecting unit for picking up the carrier.

10. The die bonding apparatus according to claim 1, further comprising:
    a bonding material disposition mechanism disposing a bonding material onto the die or the die bonding surface of the substrate.

11. The die bonding apparatus according to claim 1, further comprising:
    a position sensing mechanism, wherein the substrate is disposed between the position sensing mechanism and the die ejecting mechanism.

12. The die bonding apparatus according to claim 11, wherein the position sensing mechanism senses relative positions in two dimensions of the die and the substrate disposed on the carrier on the plane parallel to the die bonding surface.

13. The die bonding apparatus according to claim 1, further comprising:
    a third shift unit for driving the carrier to shift.

14. The die bonding apparatus according to claim 13, wherein the third shift unit drives the carrier to shift relatively to the substrate in two dimensions.

15. A die bonding apparatus cooperating to a die and a substrate having a die bonding surface, comprising:
    a carrier carrying the die;
    a die ejecting mechanism comprising at least one ejecting unit; and
    a substrate holding mechanism holding the substrate and disposed opposite to the die ejecting mechanism, the substrate and the die ejecting mechanism moving relatively to each other in two dimensions on a plane parallel to the die bonding surface,
    wherein the carrier is located between the die ejecting mechanism and the substrate, and the at least one ejecting unit pushes against the carrier for transferring the die on the carrier directly onto the die bonding surface of the substrate, and
    wherein the die bonding surface of the substrate faces downward, the substrate is disposed above the at least one ejecting unit, and the at least one ejecting unit pushes against the carrier from below.

* * * * *